(12) United States Patent
Lin et al.

(10) Patent No.: US 7,834,354 B2
(45) Date of Patent: Nov. 16, 2010

(54) PIXEL STRUCTURE AND METHOD FOR MANUFACTURING THE SAME

(75) Inventors: Hsiang-Lin Lin, Hsinchu (TW); Ching-Huan Lin, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 244 days.

(21) Appl. No.: 12/040,281

(22) Filed: Feb. 29, 2008

(65) Prior Publication Data

US 2009/0108259 A1    Apr. 30, 2009

(30) Foreign Application Priority Data

Oct. 31, 2007    (TW) ............................... 96141108 A

(51) Int. Cl.
*H01L 29/04* (2006.01)
(52) U.S. Cl. ............. 257/59; 257/E27.112; 257/E21.7; 438/155; 438/158
(58) Field of Classification Search .................... 257/59
See application file for complete search history.

(56) References Cited

U.S. PATENT DOCUMENTS

2005/0128399 A1\*  6/2005  Kim et al. ................... 349/129
2006/0146245 A1    7/2006  Ahn et al.

FOREIGN PATENT DOCUMENTS

CN    1797157    7/2006

OTHER PUBLICATIONS

Chinese language office action dated Mar. 27, 2009.
\* cited by examiner

*Primary Examiner*—Ajay K Arora
(74) *Attorney, Agent, or Firm*—Thomas, Kayden, Horstemeyer & Risley, LLP

(57) ABSTRACT

A pixel structure of a fringe field switching liquid crystal display (FFS-LCD) and a method for manufacturing the pixel structure are provided. Compared to the conventional method of using seven photolithography-etching processes for manufacturing a pixel structure, the method of the present invention uses only six photolithography-etching processes that save manufacturing costs and time. Furthermore, the pixel structure thereby only comprises two insulating layers, and thus, the light transmittance thereof can be increased in comparison to the conventional pixel structure comprising three insulating layers.

23 Claims, 15 Drawing Sheets

PIXEL STRUCTURE AND METHOD FOR MANUFACTURING THE SAME

This application claims priority to Taiwan Patent Application No. 096141108 filed on Oct. 31, 2007, the disclosures of which are incorporated herein by reference in their entirety.

CROSS-REFERENCES TO RELATED APPLICATIONS

This application is related to co-pending U.S. patent application Ser. No. 11/941,534, filed on Nov. 16, 2007, and entitled "Pixel Structures, Methods of Forming the Same and Multi Domain Vertical Alignment LCDs."

BACKGROUND OF THE INVENTION

1. Field of the Invention

The present invention provides a pixel structure and a manufacture method for use in a liquid crystal display (LCD), specifically, in a fringe field switching LCD (FFS-LCD).

2. Descriptions of the Related Art

Among all kinds of display products currently available, the liquid crystal display (LCD) is becoming the mainstream product. However, there are still some image display problems in LCDs, such as slow response speed and low aperture ratios. To overcome such problems, a fringe field switching LCD (FFS-LCD) has been proposed, which, compared to the conventional in-plane switching LCD (IPS-LCD), has an improved aperture ratio, a better overall light transmittance, and also a higher response speed.

In the pixel structure of the FFS-LCD, the pixel electrode and common electrode are stacked with and insulated from each other in the display area. In particular, the pixel electrode contains a slit structure so that when a voltage is applied to the pixel electrode and the common electrode, an electric field is generated between the fringe of the slit structure of the pixel electrode and the common electrode to control the twisting of the liquid crystal molecules in the pixel structure.

The pixel structure of a conventional FFS-LCD is depicted in FIG. 1A and FIG. 1B, and a manufacturing method thereof is depicted in FIG. 1C to FIG. 1I. The pixel structure comprises a control area 111 and a display area 112. For convenience, FIGS. 1B to 1I are depicted as cross-sectional views taken along lines A-A', B-B' and C-C' in FIG. 1A. In manufacturing the pixel structure of a conventional FFS-LCD, a patterned first metallic layer 120 is initially formed on the substrate 110 by a photolithography-etching process. As shown in FIG. 1C, the patterned first metallic layer 120 comprises a gate electrode 121 and a gate line 123, in which the gate line 123 is extended to the pad area 113 of the substrate 110.

Subsequently, the first insulating layer 130 is formed to overlay the first metallic layer 120. Then, a patterned semi-conductive layer 140 is formed on the first insulating layer 130 corresponding to the gate electrode 121 by a second photolithography-etching process, as shown in FIG. 1D. The semi-conductive layer 140 may comprise a semi-conductive channel layer and an ohmic contact layer (not shown).

Next, a first contact hole 131 is formed on the first insulating layer 130 by a third photolithography-etching process to partially expose the gate line 123 in the pad area 113, as shown in FIG. 1E. Following this, a patterned second metallic layer 150 is formed by a fourth photolithography-etching process. The second metallic layer 150 comprises a source electrode 151, a drain electrode 152, a data line 153 and a first gate line pad layer 154, which are formed simultaneously. The source electrode 151 and the drain electrode 152 are electrically connected to the semi-conductive layer 140 respectively. The data line 153 is configured to receive a signal for controlling the pixel structure. The first gate line pad layer 154 is electrically connected to the gate line 123 via the first contact hole 131, as shown in FIG. 1F.

Thereafter, a second insulating layer 160 is formed to overlay the aforesaid structure. Then, a patterned transparent electrode layer is formed on the second insulating layer 160 by a fifth photolithography-etching process to form a common electrode 171, as shown in FIG. 1G Then, a third insulating layer 180 is formed, and the third insulating layer 180 and the second insulating layer 160 are patterned by a sixth photolithography-etching process. As a result, a second contact hole 181 is etched, partially exposing the drain electrode 152. Likewise, a third contact hole 182 is etched as well, partially exposing the first gate line pad layer 154, as shown in FIG. 1H. Next, a seventh photolithography-etching process is performed to form a patterned third metallic layer 190, which comprises a pixel electrode 191 and a second gate line pad layer 192. The pixel electrode 191 is formed on the display area 112 and is electrically connected to the drain electrode 152 via the second contact hole 181, while the second gate line pad layer 192 is electrically connected to the first gate line pad layer 154 via the third contact hole 182. Thereby, the second gate line pad layer 192 is electrically connected to the gate line 123 electrically, as shown in FIG. 1I.

In summary, in manufacturing the pixel structure of a conventional FFS-LCD, at least seven photolithography-etching processes are needed. The pixel structure formed comprises three insulating layers to give rise to high manufacturing costs and long manufacturing times. Accordingly, it is highly desirable to reduce the number of photolithography-etching processes and insulating layers required, while still maintaining the aperture ratio of the pixel structure.

SUMMARY OF THE INVENTION

One objective of this invention is to provide a pixel structure and a method of manufacturing the same which requires only six photolithography-etching processes. As compared to the conventional manufacturing method, the method of this invention will necessarily save both manufacturing cost and time.

Another objective of this invention is to provide a pixel structure comprising two insulating layers and a method of manufacturing the same. As compared to the conventional pixel structure, the pixel structure of this invention has a higher light transmittance.

A method for manufacturing a pixel structure is disclosed in this invention, which comprises the following steps: forming a patterned first conductive layer on the substrate, wherein the patterned first conductive layer comprises a data line and a gate electrode; forming a first insulating layer on the substrate to overlay the patterned first conductive layer; forming a patterned semi-conductive layer on the first insulating layer above the gate electrode; forming a patterned second conductive layer, which comprises a source electrode, a drain electrode and a gate line, wherein the source electrode and the drain electrode are independently disposed on the patterned semi-conductive layer, while the gate electrode, the patterned semi-conductive layer, the source electrode and the drain electrode form a thin-film transistor (TFT) structure on the control area of the pixel structure; forming a pixel electrode, electrically connected to the drain electrode and overlaying the display area; forming a second insulating layer; patterning the second insulating layer and the first insulating layer to partially expose the data line, the source electrode, the gate line and the gate electrode; and forming a patterned third conductive layer, which comprises a data line connecting electrode, a gate line connecting electrode and a common electrode, wherein the data line connecting electrode is electrically connected to the data line and the source electrode, the gate line connecting electrode is electrically connected to the gate line and the gate electrode, and the common electrode is formed on the second insulating layer on the display area.

Another method for manufacturing a pixel structure is further disclosed in this invention, which comprises the following steps: forming a patterned first conductive layer on the substrate, wherein the patterned first conductive layer comprises a data line and a gate electrode; forming a first insulating layer on the substrate to overlay the patterned first conductive layer; forming a patterned semi-conductive layer on the first insulating layer above the gate electrode; forming a patterned second conductive layer, which comprises a source electrode, a drain electrode and a gate line, wherein the source electrode and the drain electrode are independently disposed on the patterned semi-conductive layer, and the gate electrode, the patterned semi-conductive layer, the source electrode and the drain electrode form a TFT structure on the control area of the pixel structure; forming a common electrode overlaying the display area of the pixel structure; forming a second insulating layer; patterning the second insulating layer and the first insulating layer to partially expose the data line, the source electrode, the drain electrode, the gate line and the gate electrode; and forming a patterned third conductive layer, which comprises a data line connecting electrode, a gate line connecting electrode and a pixel electrode, wherein the data line connecting electrode is electrically connected to the data line and the source electrode, the gate line connecting electrode is electrically connected to the gate line and the gate electrode, and the pixel electrode is formed on the second insulating layer in the display area and electrically connected to the drain electrode.

A pixel structure is also disclosed in this invention, which comprises a gate line, a data line, a TFT structure, a data line connecting electrode, a gate line connecting electrode and a display structure. The data line and the gate line corporately define a pixel area which comprises a control area and a display area. The TFT structure is formed on the control area and comprises a gate electrode, a source electrode and a drain electrode. The data line connecting electrode is electrically connected to the source electrode and the data line. The gate line connecting electrode is electrically connected to the gate electrode and the gate line. The display structure is formed on the display area and comprises a common electrode and a pixel electrode, which are partially overlaid with and isolated from each other, wherein the pixel electrode is electrically connected to the drain electrode.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

This invention relates to a method for manufacturing a pixel structure of an in-plane switching LCD (IPS-LCD), particularly, a fringe field switching LCD (FFS-LCD). The FFS-LCD of this invention comprises a plurality of pixel structures. A manufacturing method of each will be described in detail as follows.

Figure 1A:
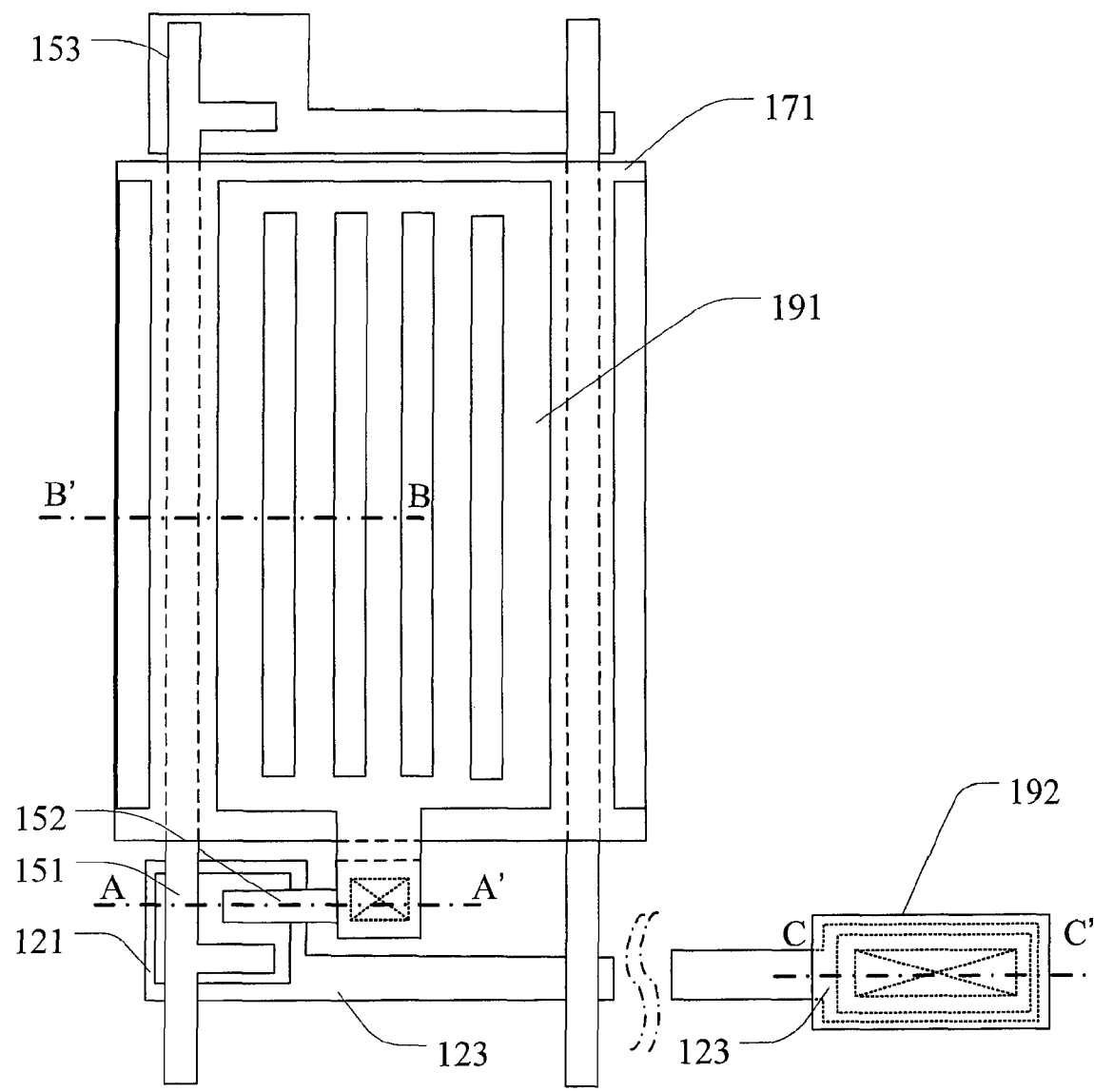
FIG. 1A is a schematic plane view of a conventional pixel structure.
Figure 1B:
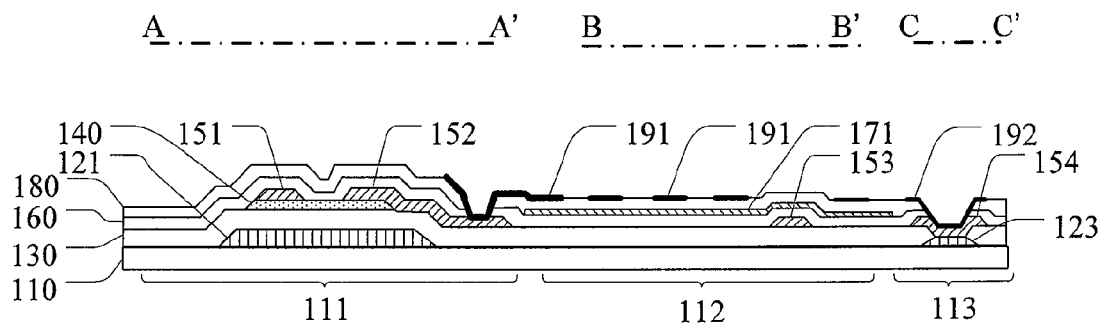
FIG. 1B is a cross-sectional view of the conventional pixel structure.
Figure 1C:
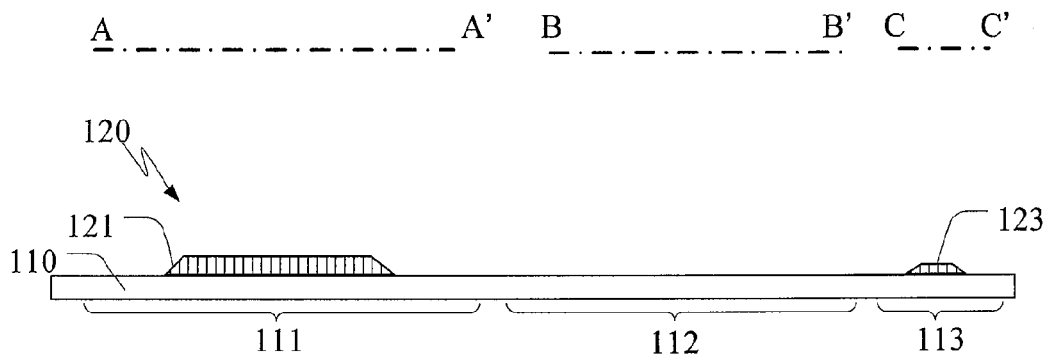
FIGS. 1C~1I illustrate the manufacturing process of the conventional pixel structure.
Figure 1D:
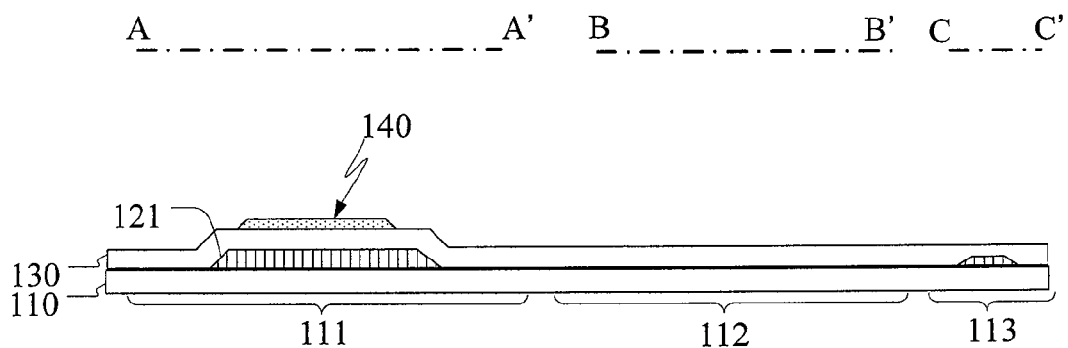
Figure 1E:
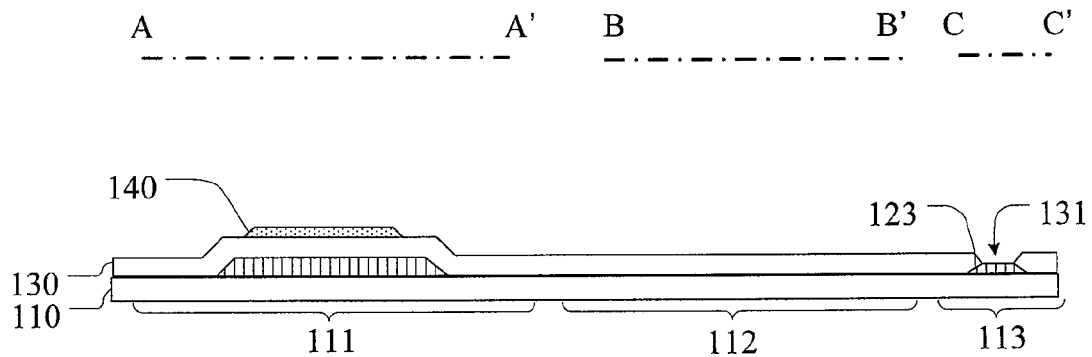
Figure 1F:
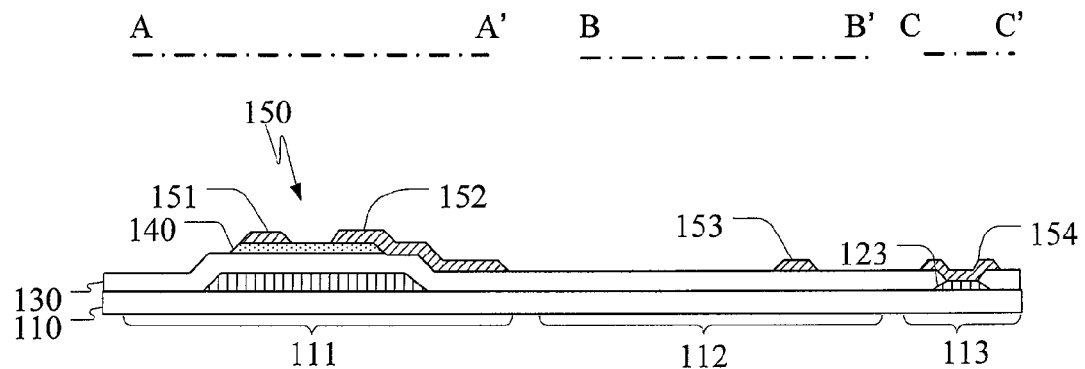
Figure 1G:
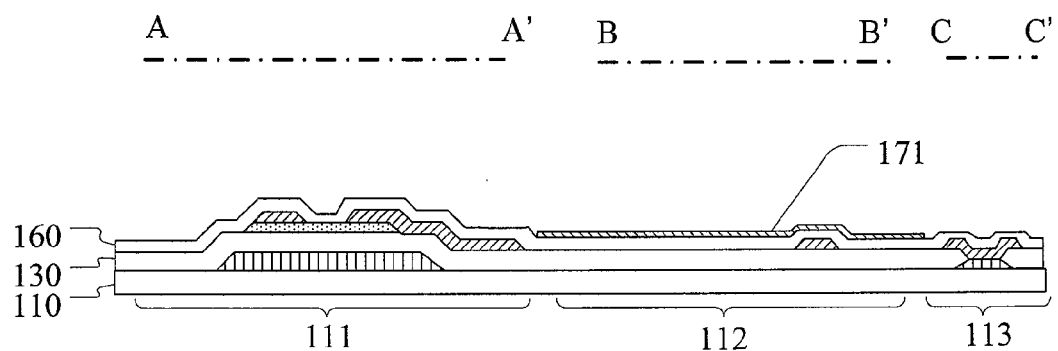
Figure 1H:
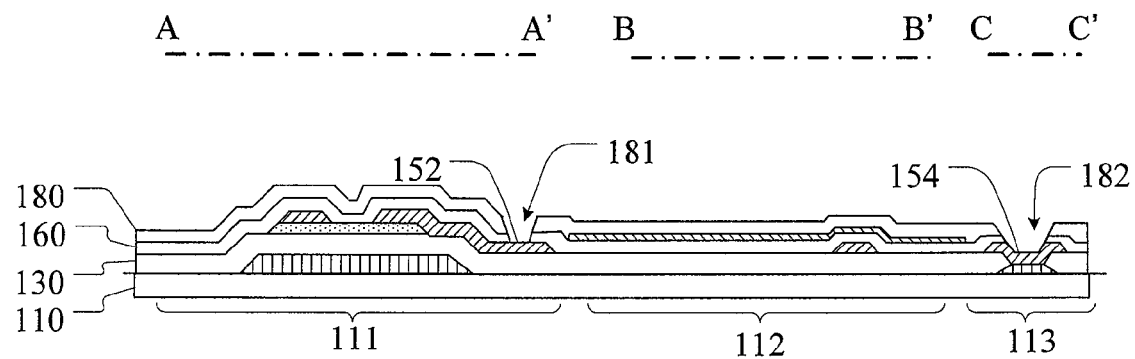
Figure 1I:
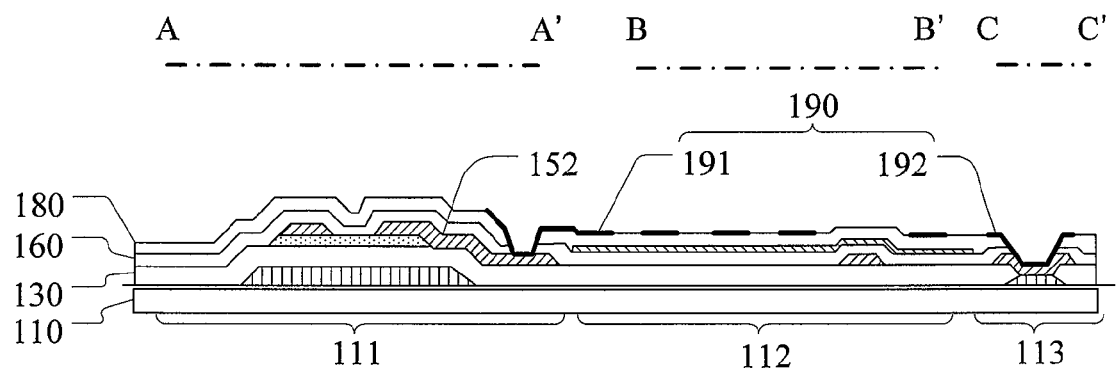
Figure 2A:
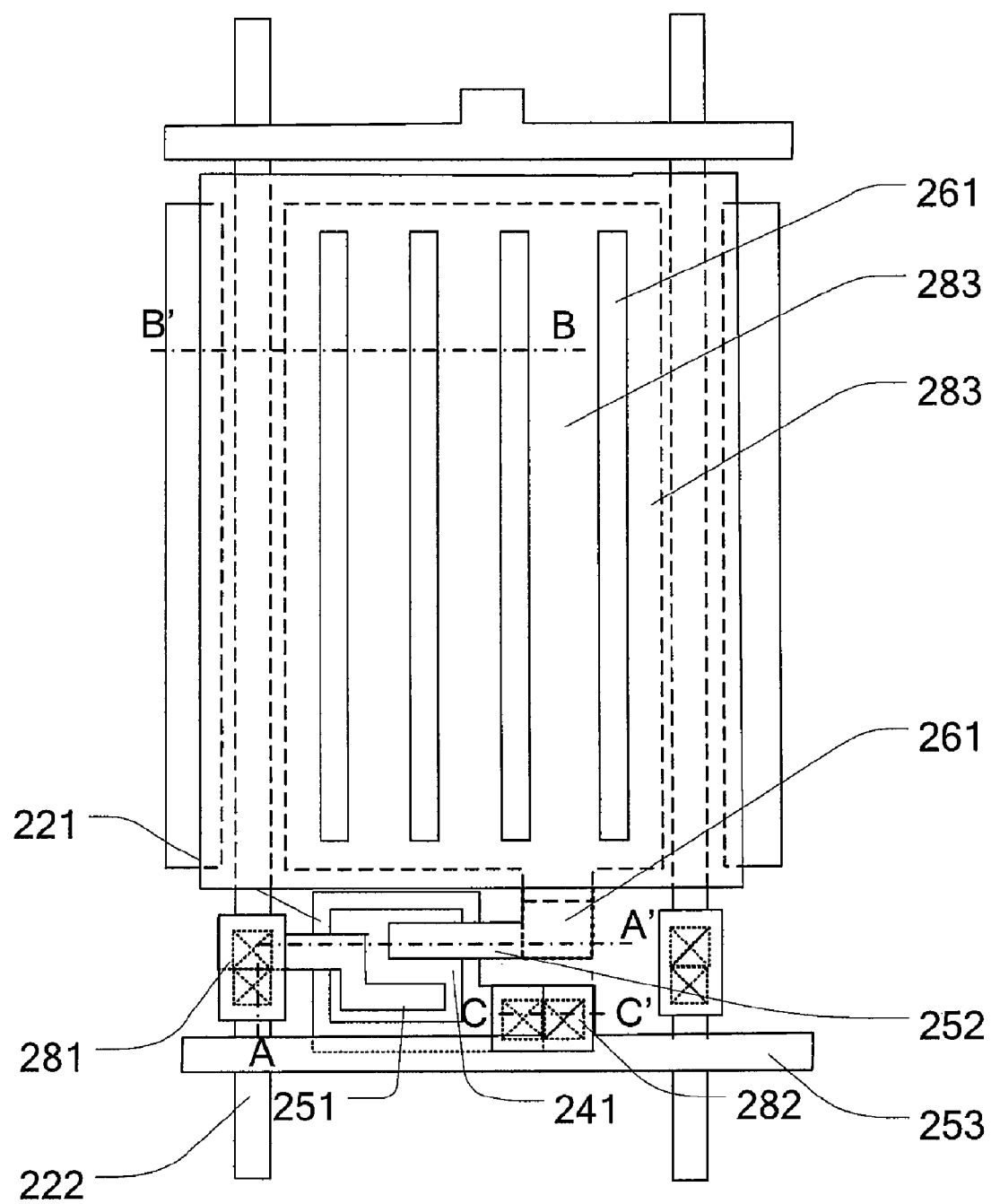
FIG. 2A is a schematic plane view of a pixel structure in accordance with the first embodiment of this invention.
Figure 2B:
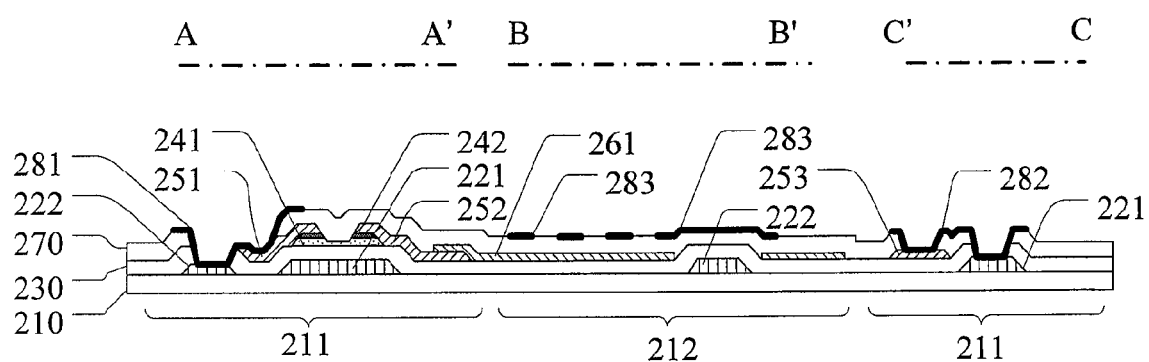
FIG. 2B is a cross-sectional view of the pixel structure in accordance with the first embodiment of this invention.

The first embodiment of this invention discloses a method for manufacturing the pixel structure. A pixel structure manufactured according to this method is shown in FIG. 2A and FIG. 2B, which illustrate the top and cross-sectional views of the pixel structure respectively. The pixel structure of the first embodiment comprises a control area 211 and a display area 212. The manufacturing method thereof is depicted in FIG. 2C to FIG. 2H. For convenience, FIGS. 2B to 2H are depicted as cross-sectional views taken along lines A-A', B-B' and C-C' in FIG. 2A.

Figure 2C:
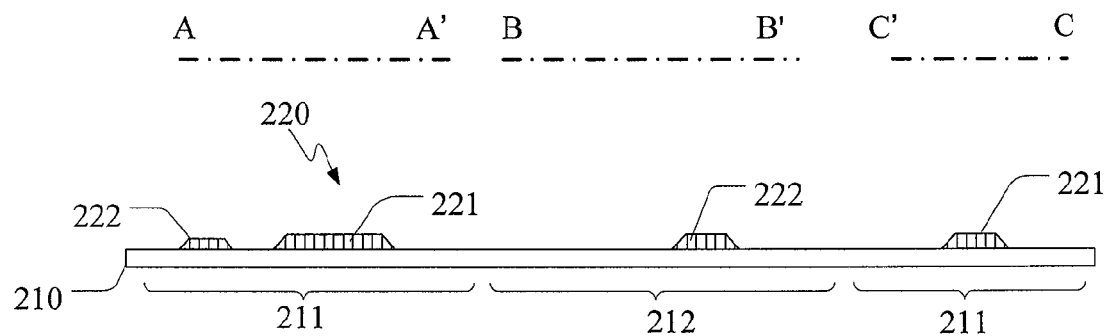
FIGS. 2C~2H are schematic views illustrating the steps of the manufacturing process in accordance with the first embodiment of this invention.

Initially, a patterned first conductive layer 220 is formed on the substrate 210 by a first photolithography-etching process. The patterned first conductive layer 220 comprises a data line 222 and a gate electrode 221, as shown in FIG. 2C. It should be noted that, as can be readily understood from the cross-sectional lines shown in FIG. 2A, the gate electrodes 221 depicted in FIG. 2C are substantially a single electrode structure, and are shown separately to disclose the concept of this invention more clearly. This is also the case for data line 222. In more detail, in forming the patterned first conductive layer 220, a first conductive layer is deposited on the substrate 210 first, followed by the formation of a first patterned photo-resist layer (not shown) on the first conductive layer. Then, an etching process is performed to form the data line 222 and the gate electrode 221 as shown in FIG. 2C. Finally, the first patterned photo-resist layer is removed.

Figure 2D:
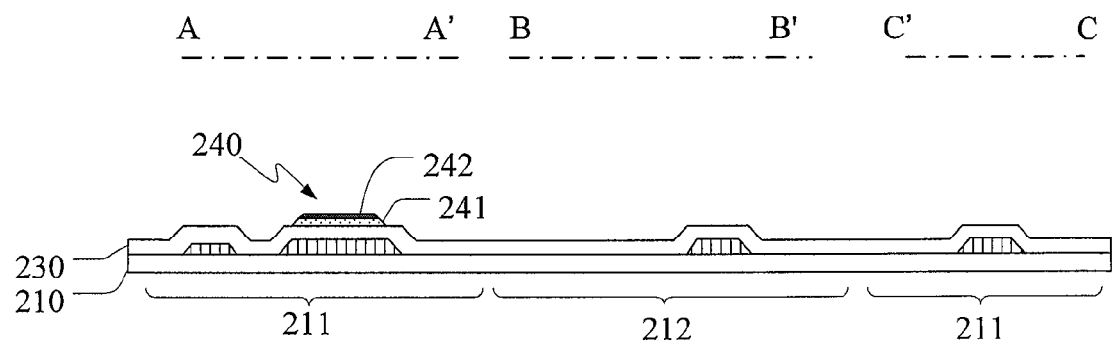

Subsequently, as shown in FIG. 2D, a first insulating layer 230 is formed to overlay the patterned first conductive layer 220, followed by a second photolithography-etching process of this embodiment where a patterned semi-conductive layer 240 is formed on the first insulating layer 230 above the gate electrode 221. The semi-conductive layer 240, which is also known as an active layer, comprises a semi-conductive channel layer 241 and an ohmic contact layer 242. In the second photolithography-etching process, the semi-conductive layer 240 may be deposited at first and then implanted with N+ ions, or a doped semi-conductive layer is deposited on the semi-conductive channel layer 241, thus forming an ohmic contact layer 242 on the semi-conductive channel layer 241. Thereafter, a second patterned photo-resist layer (not shown) is formed on the ohmic contact layer 242, followed by a second etching process where the semi-conductive channel layer 241 and the ohmic contact layer 242 corresponding to the gate electrode 221 are remained. Finally, the second patterned photo-resist layer is removed to obtain the aforesaid structure.

Figure 2E:
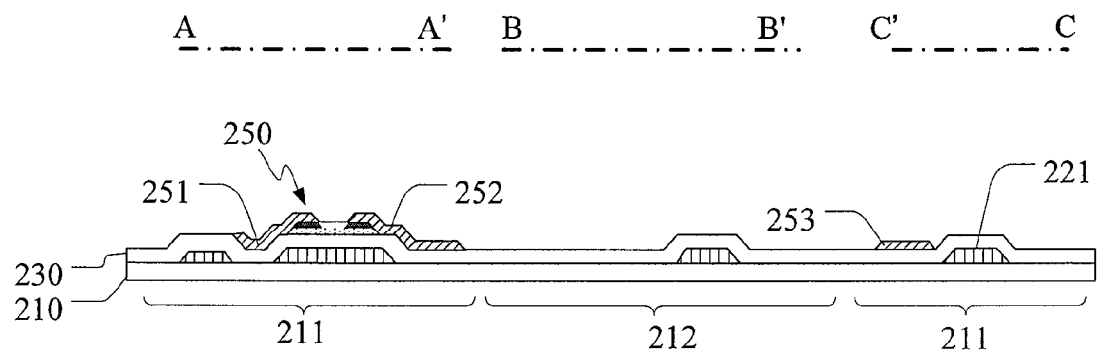

In a third photolithography-etching process of this embodiment, a patterned second conductive layer 250 comprising a source electrode 251, a drain electrode 252 and a gate line 253 is formed. The source electrode 251 and the drain electrode 252 are located separately on the corresponding portions of the ohmic contact layer 242, while the gate electrode 221, the semi-conductive layer 240, the source electrode 251 and the drain electrode 252 form a thin film transistor (TFT) structure in the control area 211, as shown in FIG. 2E. In more detail, the procedure of forming the patterned second conductive layer 250 comprises the following steps: depositing a second conductive layer; forming a third patterned photo-resist layer (not shown) on the second conductive layer; performing an etching process to remove portions of the second conductive layer, thereby to form the source electrode 251 and the drain electrode 252 on the corresponding portions of the ohmic contact layer 242 and to form the gate line 253 simultaneously; and finally, removing the third patterned photo-resist layer.

Figure 2F:
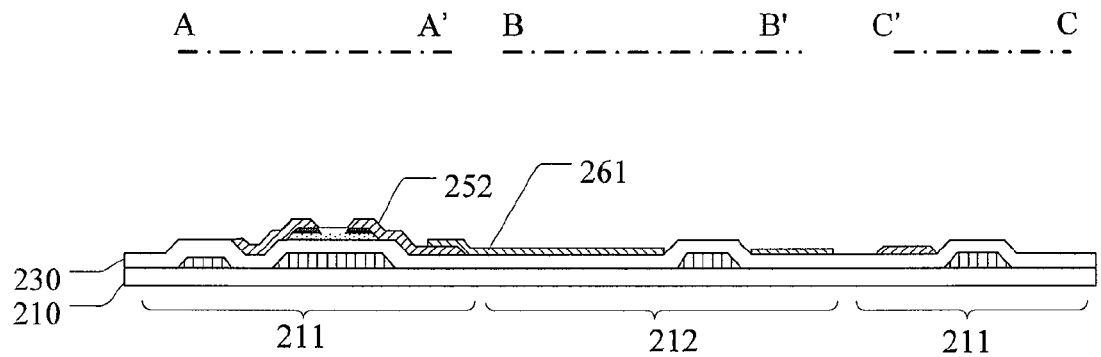

Subsequently, in a fourth photolithography-etching process of this embodiment, a pixel electrode 261 electrically connected to the drain electrode 252 is formed to at least overlay the display area 212, as shown in FIG. 2F. More specifically, the procedure of forming the pixel electrode 261 comprises the following steps: depositing a transparent electrode layer made of indium tin oxide (ITO); forming a fourth patterned photo-resist layer (not shown) on the transparent electrode layer; performing an etching process to form the pixel electrode 261 on the first insulating layer 230 in the display area 212 and on a portion of the drain electrode 252, to electrically connect the pixel electrode 261 with the drain electrode 252; and finally, removing the fourth patterned photo-resist layer.

Figure 2G:
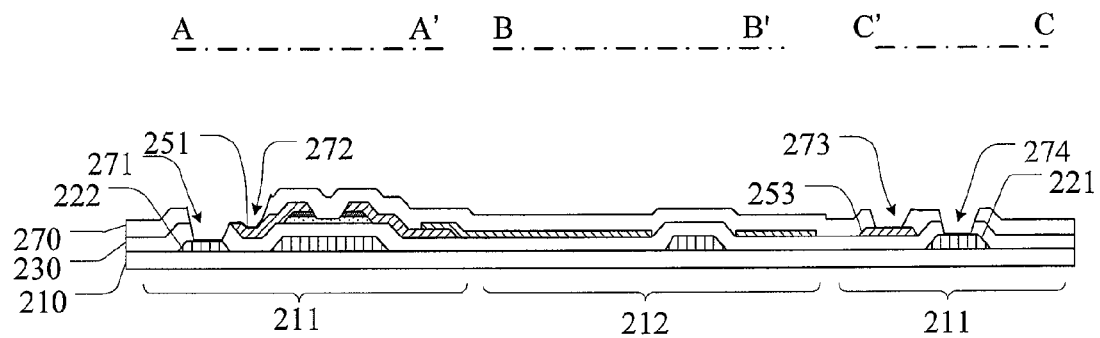

Then, a second insulating layer 270 is deposited. In the fifth photolithography-etching process, the second insulating layer 270 and the first insulating layer 230 are patterned to partially expose the data line 222, the source electrode 251, the gate line 253 and the gate electrode 221, as shown in FIG. 2G The procedure of patterning the second insulating layer 270 and the first insulating layer 230 comprises the following steps: forming a fifth patterned photo-resist layer (not shown) on the second insulating layer 270; performing an etching process to remove portions of the second insulating layer 270 and the first insulating layer 230, thereby to form a first contact hole 271 exposing the data line 222, a second contact hole 272 exposing the source electrode 251, a third contact hole 273 exposing the gate line 253 and a fourth contact hole 274 exposing the gate electrode 221; and finally, removing the fifth patterned photo-resist layer.

Figure 2H:
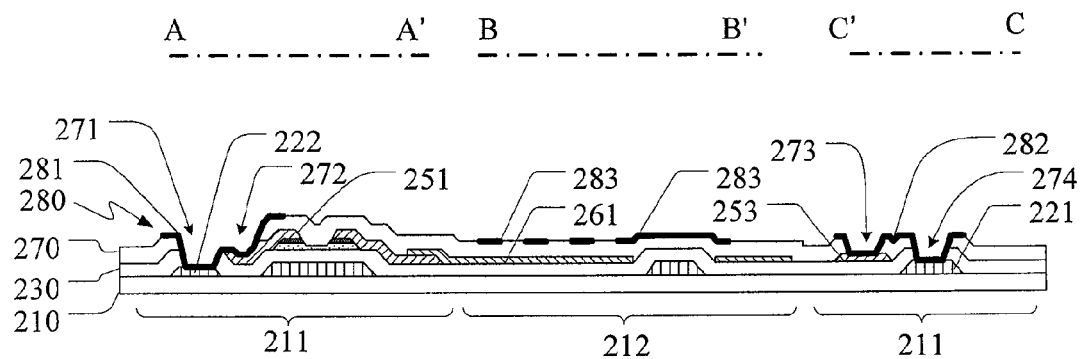

In the sixth photolithography-etching process of this embodiment, a patterned third conductive layer 280 is formed as a transparent conductive layer, as shown in FIG. 2H. The patterned third conductive layer 280 comprises a data line connecting electrode 281, a gate line connecting electrode 282 and a common electrode 283. The data line connecting electrode 281 is electrically connected to the data line 222 and the source electrode 251 via the first contact hole 271 and the second contact hole 272. The gate line connecting electrode 282 is electrically connected to the gate line 253 and the gate electrode 221 via the third contact hole 273 and the fourth contact hole 274. The common electrode 283 is formed on the second insulating layer 270 above the display area 212, wherein the common electrode 283 is electrically insulated from the pixel electrode 261 and has a plurality of slits for forming the fringe field switching structure. In more detail, the procedure of forming the patterned third conductive layer 280 comprises the following steps: depositing a transparent third conductive layer; forming a sixth patterned photo-resist layer (not shown) on the third conductive layer; performing an etching process to form the data line connecting electrode 281, the gate line connecting electrode 282 and the common electrode 283, which has slits; and finally, removing the sixth patterned photo-resist layer.

In the pixel structure on the pixel area defined by the gate line 253 and the data line 222 in this embodiment formed by the manufacturing process described above, a TFT structure is formed in the control area 211 and a display structure is formed in the display area 212. The display structure comprises the common electrode 283 and the pixel electrode 261, which are stacked partially with each other and insulated from each other with the second insulating layer 270, wherein the pixel electrode 261 is electrically connected to the drain electrode 252 of the TFT structure, and the common electrode 283 has slits. Additionally, the source electrode 251 of the TFT structure is electrically connected to the data line 222 by means of the data line connecting electrode 281, while the gate electrode 221 is electrically connected to the gate line 253 by means of the gate line connecting electrode 282, wherein the common electrode 283, the data line connecting electrode 281 and the gate line connecting electrode 282 can be formed simultaneously in a single process. As a result, the pixel structure of this embodiment can be completed by only six photolithography-etching processes.

Figure 3A:
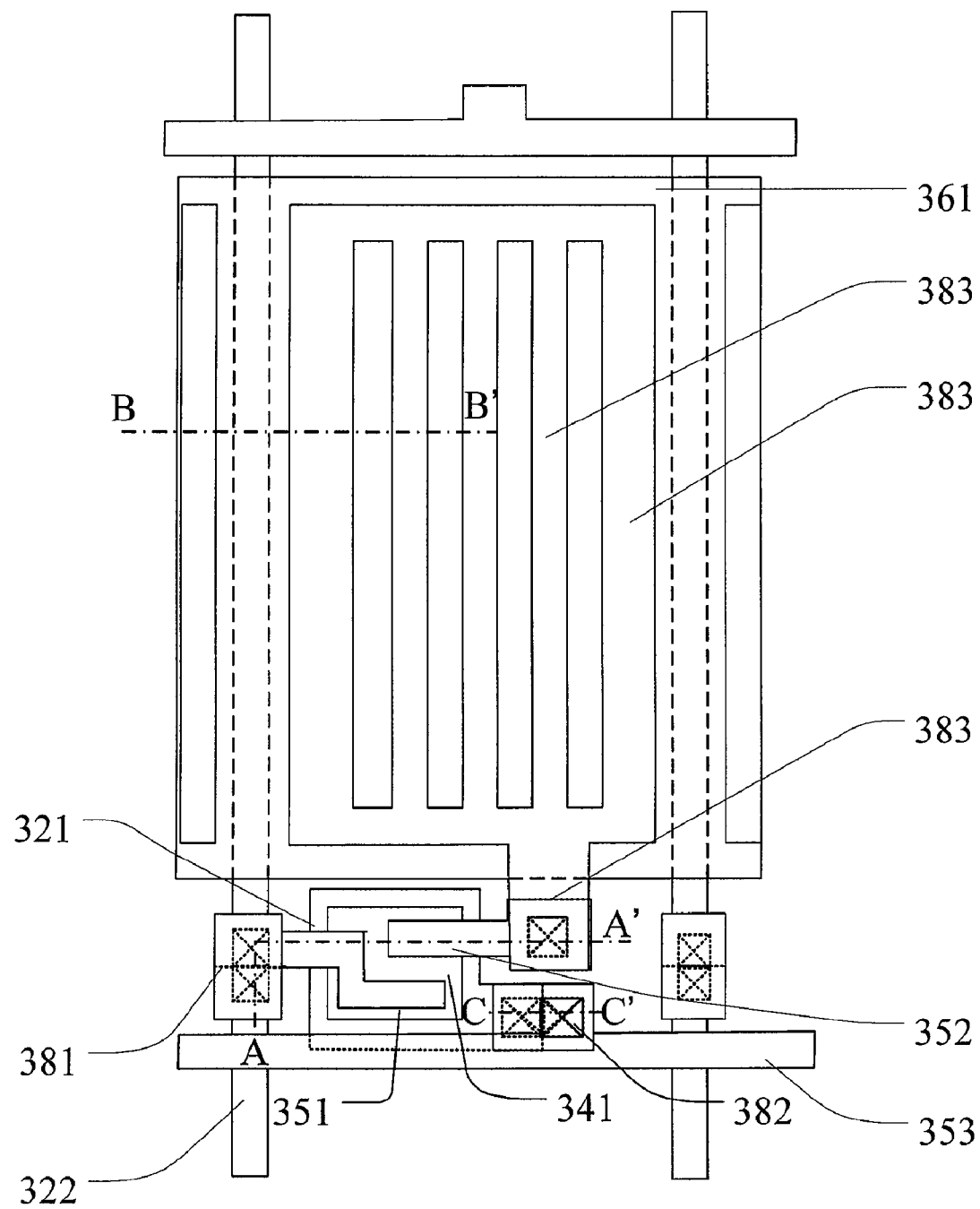
FIG. 3A is a schematic plane view of a pixel structure in accordance with the second embodiment of this invention.
Figure 3B:
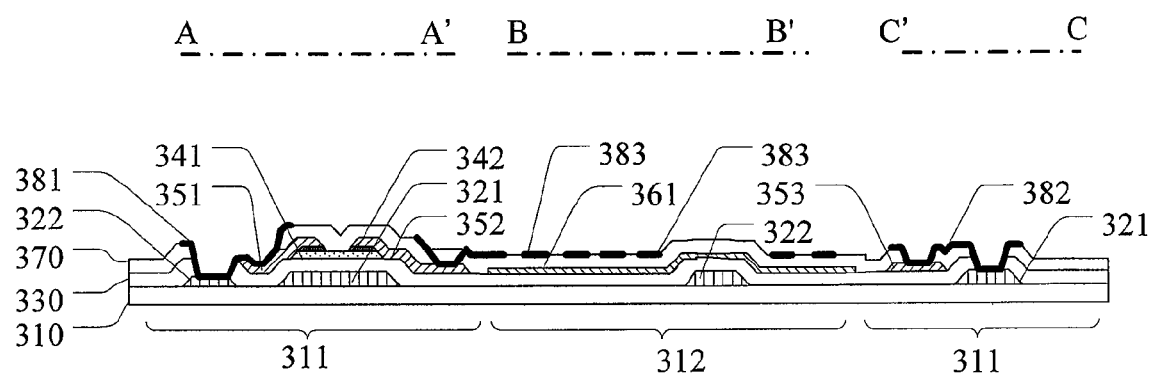
FIG. 3B is a cross-sectional view of the pixel structure in accordance with the second embodiment of this invention.

In reference to FIG. 3A and FIG. 3B, there is a method for manufacturing a pixel structure in accordance with the second embodiment of this invention and the pixel structure thus formed. The pixel structure comprises a control area 311 and a display area 312. The manufacturing method thereof disclosed in this embodiment is shown in FIGS. 3C to 3H. For convenience, FIGS. 3B to 3H are depicted as cross-sectional views taken along lines A-A', B-B' and C-C' in FIG. 3A.

Figure 3C:
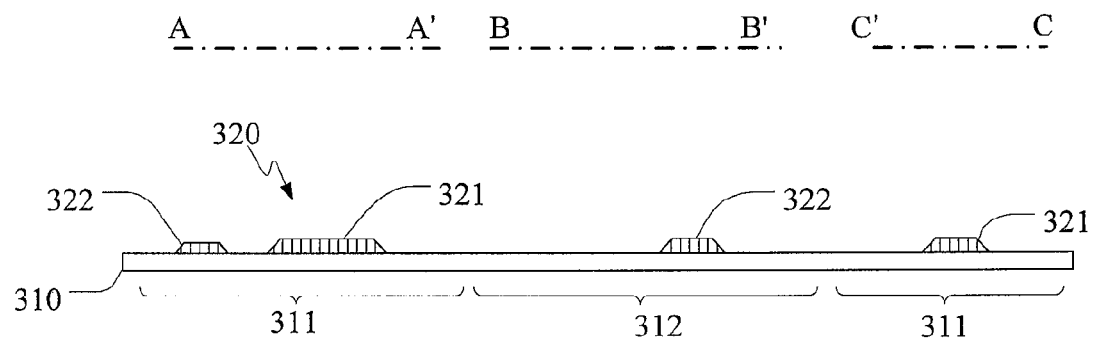
FIGS. 3C~3H illustrate the steps of the manufacturing process in accordance with the second embodiment of this invention.

As shown in FIG. 3C, in the first photolithography-etching process of this embodiment, a patterned first conductive layer 320 is formed on the substrate 310, in which the patterned first conductive layer 320 comprises a data line 322 and a gate electrode 321. It should be noted that, as can be readily understood from the cross-sectional lines shown in FIG. 3A, the gate electrodes 321 depicted in FIG. 3C are a single electrode structure, and they are shown separately to disclose the concept of this invention more clearly. This is also the case for data line 322.

The procedure of forming the patterned first conductive layer 320 on the substrate 310 comprises the following steps: depositing a first conductive layer on the substrate 310; forming a first patterned photo-resist layer (not shown) on the first conductive layer; performing an etching process to form the gate electrode 321 and the data line 322; and finally, removing the first patterned photo-resist layer.

Figure 3D:
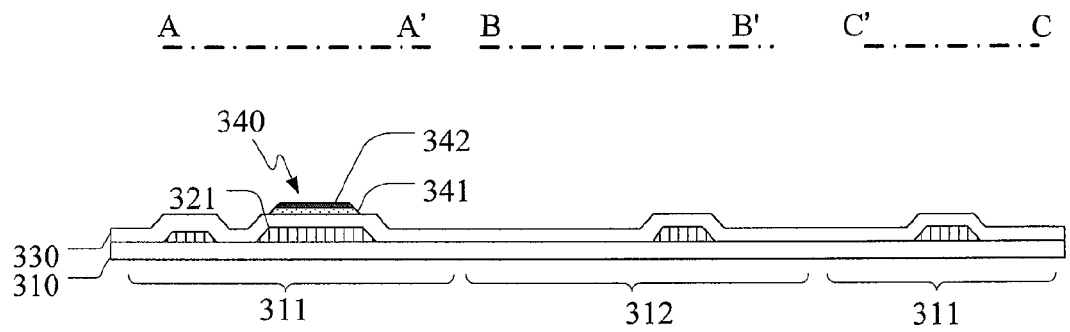

Subsequently, as shown in FIG. 3D, a first insulating layer 330 is deposited on the substrate 310 to overlay the patterned first conductive layer 320. Then, a second photolithography-etching process of this embodiment is performed to form a patterned semi-conductive layer 340 on the first insulating layer 330 above the gate electrode 321. As described above, the semi-conductive layer 340, which is also known as an active layer, comprises a semi-conductive channel layer 341 and an ohmic contact layer 342. In more detail, the procedure of forming the patterned semi-conductive layer 340 may comprise the following steps: depositing a semi-conductive layer and implanting it with N+ ions, or depositing a doped semi-conductive layer on the semi-conductive channel layer, thereby to form an ohmic contact layer 342 on the semi-conductive layer; then forming a second patterned photo-resist layer (not shown) on the ohmic contact layer 342, followed by a second etching process where the semi-conductive channel layer 341 and the ohmic contact layer 342 corresponding to the gate electrode 321 are remained; and finally, the second patterned photo-resist layer is removed.

Figure 3E:
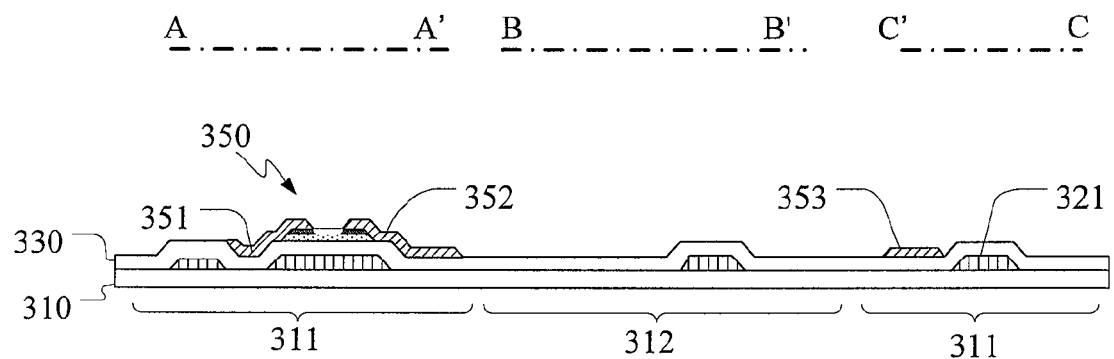

As shown in FIG. 3E, in the third photolithography-etching process of this embodiment, a patterned second conductive layer 350 comprising a source electrode 351, a drain electrode 352 and a gate line 353 is formed. The source electrode 351 and the drain electrode 352 are located separately on the corresponding portions of the ohmic contact layer 342, while the gate electrode 321 and the semi-conductive layer 340 form a thin film transistor (TFT) structure in the control area 311. In more detail, the procedure of forming the patterned second conductive layer 350 comprises the following steps: depositing a second conductive layer; forming a third patterned photo-resist layer (not shown) on the second conductive layer; performing an etching process to remove portions of the second conductive layer, thereby to form the source electrode 351 and the drain electrode 352 on the corresponding portions of the semi-conductive layer 340 and form the gate line 353 simultaneously; and finally, removing the third patterned photo-resist layer.

Figure 3F:
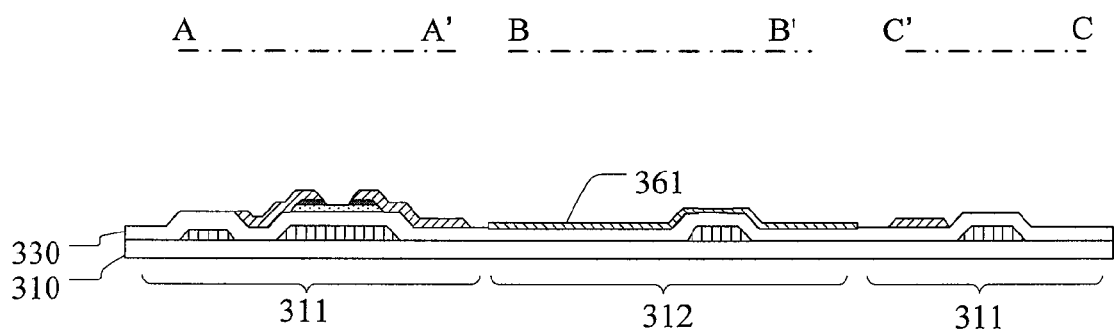

Subsequently, in the fourth photolithography-etching process of this embodiment, a patterned common electrode 361 is formed to overlay the display area 312, as shown in FIG. 3F. The procedure of forming the common electrode 361 comprises the following steps: depositing a transparent electrode layer made of indium tin oxide (ITO); forming a fourth patterned photo-resist layer (not shown) on the transparent electrode layer; performing an etching process to form the patterned common electrode 361 on the first insulating layer 330 in the display area 312; and finally, removing the fourth patterned photo-resist layer.

Figure 3G:
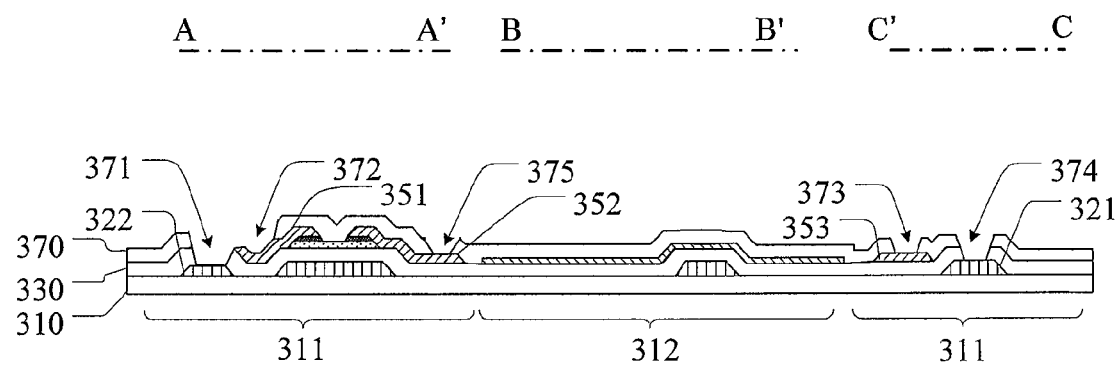

Then, a second insulating layer 370 is deposited, and in a fifth photolithography-etching process, the second insulating layer 370 and the first insulating layer 330 are patterned to partially expose the data line 322, the source electrode 351, the drain electrode 352, the gate line 353 and the gate electrode 321, as shown in FIG. 3G. In more detail, the procedure of patterning the second insulating layer 370 and the first insulating layer 330 comprises the following steps: forming a fifth patterned photo-resist layer (not shown) on the second insulating layer 370; performing an etching process to remove portions of the second insulating layer 370 and the first insulating layer 330, thereby to form a first contact hole 371 exposing the data line 322, a second contact hole 372 exposing the source electrode 351, a third contact hole 373 exposing the gate line 353, a fourth contact hole 374 exposing the gate electrode 321, and a fifth contact hole 375 exposing the drain electrode 352; and finally, removing the fifth patterned photo-resist layer.

Figure 3H:
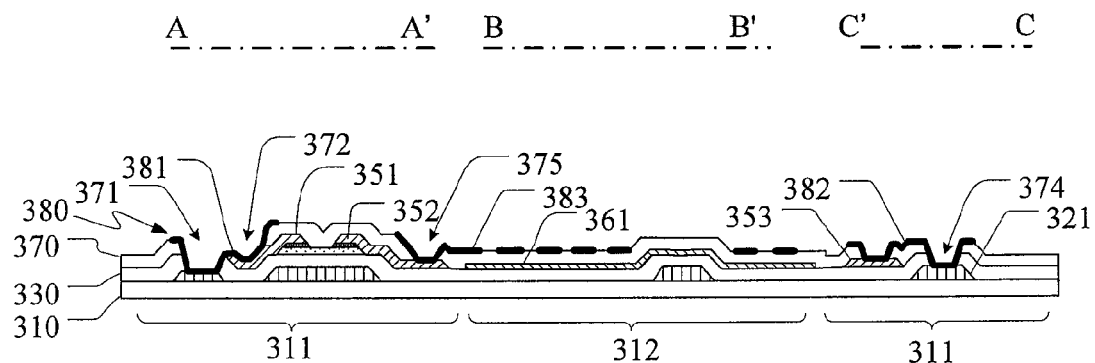

As shown in FIG. 3H, in the sixth photolithography-etching process of this embodiment, a patterned third conductive layer 380 is formed as the transparent conductive layer. The patterned third conductive layer 380 comprises a data line connecting electrode 381, a gate line connecting electrode 382 and a pixel electrode 383. The data line connecting electrode 381 is electrically connected to the data line 322 and the source electrode 351. The gate line connecting electrode 382 is electrically connected to the gate line 353 and the gate electrode 321. The pixel electrode 383 is formed on the second insulating layer 370 in the display area 312, and electrically connected to the drain electrode 352. The pixel electrode 383 has a plurality of slits and is electrically insulated from the common electrode 361.

More specifically, the procedure of forming the patterned third conductive layer 380 comprises the following steps: depositing a transparent third conductive layer; forming a sixth patterned photo-resist layer (not shown) on the third conductive layer; performing an etching process to form the data line connecting electrode 381, the gate line connecting electrode 382 and the pixel electrode 383 respectively. The data line connecting electrode 381 is electrically connected to the data line 322 and the source electrode 351 via the first contact hole 371 and the second contact hole 372. The gate line connecting electrode 382 is electrically connected to the gate line 353 and the gate electrode 321 via the third contact hole 373 and the fourth contact hole 374. The pixel electrode 383 is formed on the second insulating layer 370 in the display area 312 and electrically connected to the drain electrode 352 via the fifth contact hole 375, while the pixel electrode 383 is insulated from the common electrode 361 by the second insulating layer 370. Finally, the sixth patterned photo-resist layer is removed.

The pixel structure formed in this embodiment by the manufacturing process described above differs slightly from the pixel structure of the first embodiment. In this embodiment, the pixel electrode 383 is formed on the second insulating layer 370, has a plurality of slits, and is electrically connected to the drain electrode 352 of the TFT structure, while the common electrode 361 is formed beneath the second insulating layer 370. Similarly, the common electrode 361, the data line connecting electrode 381 and the gate line connecting electrode 382 all can be formed simultaneously in a single process. As a result, the pixel structure of this embodiment can be completed by only six photolithography-etching processes.

It follows from the above description that as compared to conventional technologies, which require seven photolithography-etching processes, the pixel structure of the FFS-LCD utilizing this invention requires only six photolithography-etching processes, thus saving both manufacturing costs and time. Furthermore, as compared to the conventional pixel structure, which comprised three insulating layers, the pixel structure of this invention comprises only two insulating layers, which may further improve the light transmittance of the pixel structure.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for manufacturing a pixel structure, the pixel structure comprising a control area and a display area, the method comprising the steps of:

forming a patterned first conductive layer on a substrate, wherein the patterned first conductive layer comprises a data line and a gate electrode;

forming a first insulating layer on the substrate to overlay the patterned first conductive layer;

forming a patterned semi-conductive layer on the first insulating layer above the gate electrode;

forming a patterned second conductive layer, the patterned second conductive layer comprising a source electrode, a drain electrode and a gate line, wherein the source electrode and the drain electrode are independently disposed on the patterned semi-conductive layer, and the gate electrode, the patterned semi-conductive layer, the source electrode and the drain electrode form a thin-film transistor (TFT) structure on the control area;

forming a pixel electrode, electrically connecting to the drain electrode and overlaying the display area;

forming a second insulating layer;

patterning the second insulating layer and the first insulating layer to partially expose the data line, the source electrode, the gate line and the gate electrode; and forming a patterned third conductive layer, the patterned third conductive layer comprising a data line connecting electrode, a gate line connecting electrode and a common electrode, wherein the data line connecting electrode electrically connects with the data line and the source electrode, the gate line connecting electrode electrically connects with the gate line and the gate electrode, and the common electrode is formed on the second insulating layer on the display area.

2. The method as claimed in claim 1, wherein the step of forming a patterned first conductive layer comprises the steps of:

depositing a first conductive layer on the substrate;

forming a first patterned photo-resist layer on the first conductive layer;

forming the data line and the gate electrode by performing an etching process; and removing the first patterned photo-resist layer.

3. The method as claimed in claim 1, wherein the step of forming a patterned semi-conductive layer is:

patterning a semi-conductive layer by using a second patterned photo-resist layer to form the patterned semi-conductive layer on the first insulating layer above the gate electrode.

4. The method as claimed in claim 1, wherein the step of forming a patterned second conductive layer comprises the steps of:

depositing a second conductive layer;

forming a third patterned photo-resist layer on the second conductive layer;

partially removing the second conductive layer by performing an etching process to form the source electrode and the drain electrode on the patterned semi-conductive layer, and to form the gate line on the first insulating layer partially above the gate electrode; and removing the third patterned photo-resist layer.

5. The method as claimed in claim 1, wherein the step of forming a pixel electrode comprises the steps of:

depositing a transparent electrode layer;

forming a fourth patterned photo-resist layer on the transparent electrode layer;

forming the pixel electrode on the first insulating layer on the display area and on the drain electrode by performing an etching process; and removing the fourth patterned photo-resist layer.

6. The method as claimed in claim 1, wherein the step of patterning the second insulating layer and the first insulating layer comprises the steps of:

forming a fifth patterned photo-resist layer on the second insulating layer;

partially removing the second insulating layer and the first insulating layer by performing an etching process, for forming a first contact hole to expose the data line, forming a second contact hole to expose the source electrode, forming a third contact hole to expose the gate line, and forming a fourth contact hole to expose the gate electrode; and removing the fifth patterned photo-resist layer.

7. The method as claimed in claim 6, wherein the step of forming a patterned third conductive layer comprises the steps of:

depositing a third conductive layer;

forming a sixth patterned photo-resist layer on the third conductive layer;

forming the data line connecting electrode, the gate line connecting electrode and the common electrode by performing an etching processing, wherein the data line connecting electrode connects with the data line and the source electrode through the first contact hole and the second contact hole, the gate line connecting electrode connects with the gate line and the gate electrode through the third contact hole and the fourth contact hole, and the common electrode is formed on the second insulating layer to be electrically isolated from the pixel electrode, and the common electrode has a plurality of slits; and removing the sixth patterned photo-resist layer.

8. The method as claimed in claim 1, wherein the third conductive layer is a transparent conductive layer.

9. A method for manufacturing a pixel structure, the pixel structure comprising a control area and a display area, the method comprising the steps of:

forming a patterned first conductive layer on a substrate, wherein the patterned first conductive layer comprises a data line and a gate electrode;

forming a first insulating layer on the substrate to overlay the patterned first conductive layer;

forming a patterned semi-conductive layer on the first insulating layer above the gate electrode;

forming a patterned second conductive layer, the patterned second conductive layer comprising a source electrode, a drain electrode and a gate line, wherein the source electrode and the drain electrode are independently disposed on the patterned semi-conductive layer, and the gate electrode, the patterned semi-conductive layer, the source electrode and the drain electrode form a TFT structure on the control area;

forming a common electrode overlaying the display area;

forming a second insulating layer;

patterning the second insulating layer and the first insulating layer to partially expose the data line, the source electrode, the drain electrode, the gate line and the gate electrode; and forming a patterned third conductive layer, the patterned third conductive layer comprising a data line connecting electrode, a gate line connecting electrode and a pixel electrode, wherein the data line connecting electrode electrically connects the data line and the source electrode, the gate line connecting electrode electrically connects the gate line and the gate electrode, and the pixel electrode is formed on the second insulating layer on the display area and electrically connects with the drain electrode.

10. The method as claimed in claim 9, wherein the step of forming a patterned first conductive layer comprises the steps of:

depositing a first conductive layer on the substrate;

forming a first patterned photo-resist layer on the first conductive layer;

forming the data line and the gate electrode by performing an etching process; and removing the first patterned photo-resist layer.

11. The method as claimed in claim 9, wherein the step of forming a patterned semi-conductive layer is:

patterning a semi-conductive layer by using a second patterned photo-resist layer to form the patterned semi-conductive layer on the first insulating layer above the gate electrode.

12. The method as claimed in claim 9, wherein the step of forming a patterned second conductive layer comprises the steps of:

depositing a second conductive layer;

forming a third patterned photo-resist layer on the second conductive layer;

partially removing the second conductive layer by performing an etching process to form the source electrode and the drain electrode on the patterned semi-conductive layer, and to form the gate line on the first insulating layer partially above the gate electrode; and removing the third patterned photo-resist layer.

13. The method as claimed in claim 9, wherein the step of forming a common electrode comprises the steps of:

depositing a transparent electrode layer;

forming a fourth patterned photo-resist layer on the transparent electrode layer;

forming the common electrode on the first insulating layer by performing an etching process; and removing the fourth patterned photo-resist layer.

14. The method as claimed in claim 9, wherein the step of patterning the second insulating layer and the first insulating layer comprises the steps of:

forming a fifth patterned photo-resist layer on the second insulating layer;

partially removing the second insulating layer and the first insulating layer by performing an etching process, for forming a first contact hole to expose the data line, forming a second contact hole to expose the source electrode, forming a third contact hole to expose the gate line, forming a fourth contact hole to expose the gate electrode and forming a fifth contact hole to expose the drain electrode; and removing the fifth patterned photo-resist layer.

15. The method as claimed in claim 14, wherein the step of forming a patterned third conductive layer comprises the steps of:

depositing a third conductive layer;

forming a sixth patterned photo-resist layer on the third conductive layer;

forming the data line connecting electrode, the gate line connecting electrode and the pixel electrode by performing an etching processing, wherein the data line connecting electrode connects with the data line and the source electrode through the first contact hole and the second contact hole, the gate line connecting electrode connects with the gate line and the gate electrode through the third contact hole and the fourth contact hole, and the pixel electrode electrically connects with the drain electrode through the fifth contact hole, and the pixel electrode has a plurality of slits; and removing the sixth patterned photo-resist layer.

16. The method as claimed in claim 9, wherein the third conductive layer is a transparent conductive layer.

17. A pixel structure, comprising:

a gate line;

a data line defining a pixel area with the gate line, wherein the pixel area comprises a control area and a display area;

a TFT structure formed on the control area, wherein the TFT structure comprises a gate electrode, a source electrode and a drain electrode;

a data line connecting electrode electrically connecting the source electrode and the data line;

a gate line connecting electrode electrically connecting the gate electrode and the gate line; and a display structure formed on the display area, and the display structure comprising a common electrode and a pixel electrode, which are partially overlaid and isolated from each other, wherein the pixel electrode electrically connects with the drain electrode;

wherein the data line and the gate electrode are formed in a patterned first conductive layer, and the data line connecting electrode and the gate line connecting electrode are formed in a patterned third conductive layer.

18. The pixel structure as claimed in claim 17, further comprising an insulating layer formed between the common electrode and the pixel electrode.

19. The pixel structure as claimed in claim 18, wherein the common electrode is formed on the insulating layer and has a plurality of slits.

20. The pixel structure as claimed in claim 19, wherein the common electrode, the data line connecting electrode and the gate line connecting electrode are formed in the patterned third conductive layer.

21. The pixel structure as claimed in claim 18, wherein the pixel electrode is formed on the insulating layer and has a plurality of slits.

22. The pixel structure as claimed in claim 21, wherein the pixel electrode, the data line connecting electrode and the gate line connecting electrode are formed in the patterned third conductive layer.

23. The pixel structure as claimed in claim 17, wherein the TFT structure further comprises a semi-conductive layer correspondingly formed above the gate electrode and connected with the source electrode and the drain electrode independently.

* * * * *